United States Patent
Ukita

(10) Patent No.: US 8,044,361 B2
(45) Date of Patent: Oct. 25, 2011

(54) RADIATION DETECTION UNIT AND RADIOGRAPHIC INSPECTION APPARATUS

(75) Inventor: Akihiro Ukita, Yokosuka (JP)

(73) Assignee: Sumitomo Heavy Industries, Ltd., Tokyo (JP)

( * ) Notice: Subject to any disclaimer, the term of this patent is extended or adjusted under 35 U.S.C. 154(b) by 716 days.

(21) Appl. No.: 12/096,042

(22) PCT Filed: Dec. 4, 2006

(86) PCT No.: PCT/JP2006/324174
§ 371 (c)(1),
(2), (4) Date: Jun. 4, 2008

(87) PCT Pub. No.: WO2007/066616
PCT Pub. Date: Jun. 14, 2007

(65) Prior Publication Data
US 2009/0242778 A1    Oct. 1, 2009

(30) Foreign Application Priority Data

Dec. 8, 2005 (JP) ................................. 2005-355134

(51) Int. Cl.
*G01J 1/24* (2006.01)
*H01L 25/00* (2006.01)

(52) U.S. Cl. ......... 250/370.09; 250/363.05; 250/363.04; 250/370.08; 438/67

(58) Field of Classification Search ............. 250/370.08, 250/370.09, 370.14, 363.04, 363.05, 366, 250/208.1, 370.15, 370.11; 257/782; 438/67, 438/74, 73, 109; 378/4, 19
See application file for complete search history.

(56) References Cited

U.S. PATENT DOCUMENTS

| | | | |
|---|---|---|---|
| 5,049,982 A * | 9/1991 | Lee et al. | 257/722 |
| 2004/0120448 A1* | 6/2004 | Ratzmann | 378/4 |
| 2005/0067577 A1* | 3/2005 | Yanagita et al. | 250/370.09 |
| 2005/0151087 A1 | 7/2005 | Ueno | |

FOREIGN PATENT DOCUMENTS

| | | |
|---|---|---|
| EP | 1555547 | 7/2005 |
| JP | 54-120589 | 9/1979 |
| JP | 62-070785 | 4/1987 |
| JP | 03-137606 | 6/1991 |
| JP | 05-41196 | 2/1993 |
| JP | 2003-043339 | 2/2003 |
| JP | 2005-128000 | 5/2005 |
| JP | 2005-201671 | 7/2005 |
| WO | WO2005/010893 | 2/2005 |

OTHER PUBLICATIONS

Chinese Office Action dated Oct. 8, 2010 with partial translation.

* cited by examiner

*Primary Examiner* — David Porta
*Assistant Examiner* — Yara Green
(74) *Attorney, Agent, or Firm* — IPUSA, PLLC

(57) ABSTRACT

Plural detection boards are stacked and fixed. The detection board has a wiring board, a semiconductor detection device fixed on an upper surface of the wiring board and configured to detect radiation, and a spacer fixed on the upper surface of the wiring board. Each of the detection boards is provided so that the semiconductor detection device and the spacer have a designated positional relationship. In addition, the spacers are stacked and matched in an X-Y plane surface with each other so that the detection boards are fixed by fixing members.

13 Claims, 18 Drawing Sheets

FIG.14
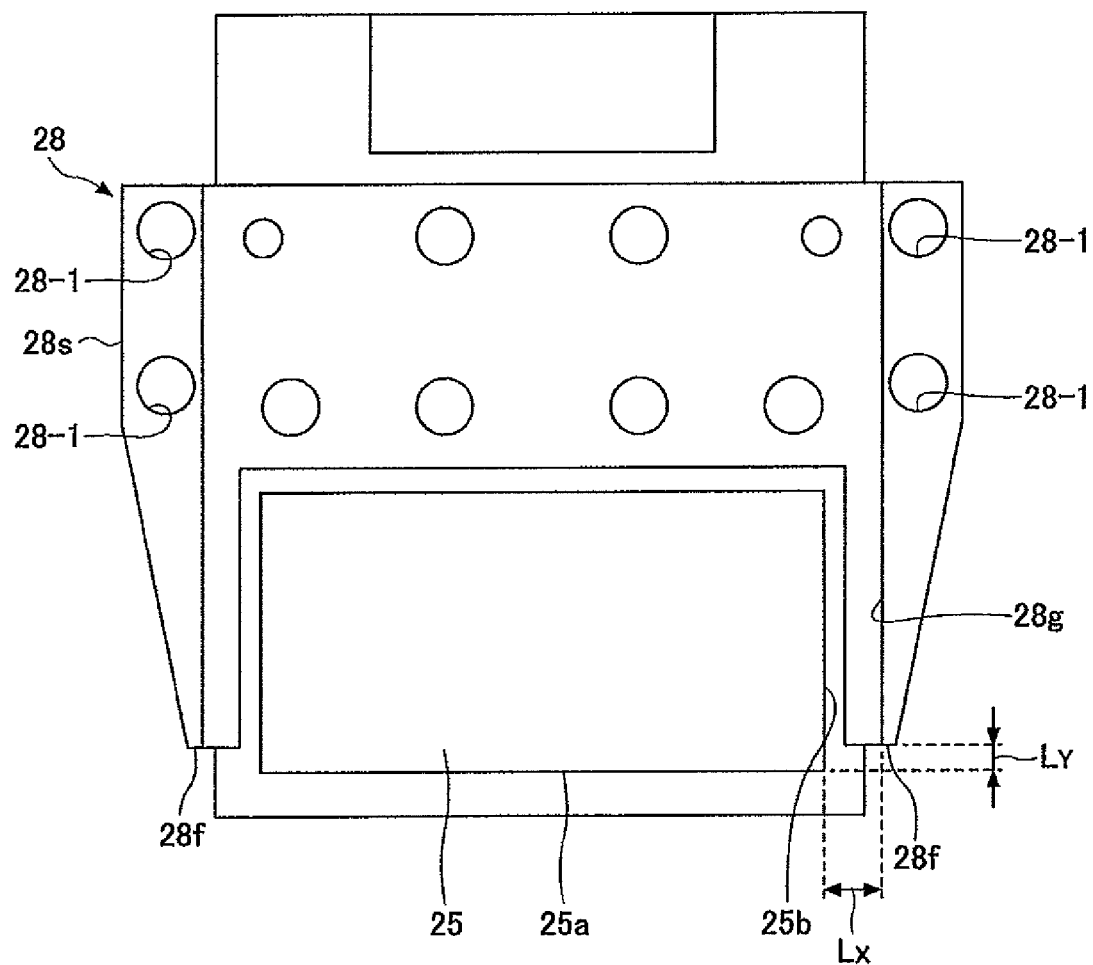
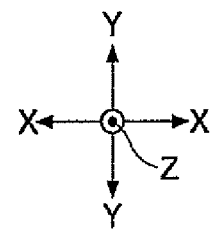

RADIATION DETECTION UNIT AND RADIOGRAPHIC INSPECTION APPARATUS

TECHNICAL FIELD

The present invention generally relates to radiation detection units having radiation semiconductor detection devices and radiographic inspection apparatuses using the radiation detection units. More specifically, the present invention relates to a radiation detection unit configured to detect gamma rays emitted from a radioisotope situated in a subject and a radiographic inspection apparatus using the radiation detection unit.

BACKGROUND ART

Recently, tomography apparatuses have been widely used in order to obtain information of the inside of a living organism (subject). There are an X-ray computed tomography (hereinafter "X-ray CT") apparatus, a magnetic resonance imaging (MRI) apparatus, a single photon emission CT (hereinafter "SPECT") apparatus, and a positron emission tomography (hereinafter "PET") apparatus, as the tomography apparatuses. In the X-ray CT apparatus, X-ray beams having narrow widths are emitted to a certain cross section of the subject in multiple directions, X-rays permeating through the subject are detected, and a spatial distribution of the degree of abruption of the X-rays in the cross section is computed by a computer and imaged. Thus, dysplasia inside the subject such as a hemorrhagic area can be recognized by the X-ray CT.

On the other hand, since functional information in the subject can be obtained with high precision by the PET apparatus, development of the PET apparatuses has been progressing recently. In a diagnostic method using the PET apparatus, first, a medicine for inspection which is identified with a positron nuclide is introduced inside the subject by an injection, inhalation, or the like. The medicine for inspection introduced in the subject is stored in a specific portion having a function corresponding to the medicine for inspection. For example, in a case where a medicine for inspection of saccharide is used, the medicine is selectively stored in a portion where metabolism of a cancer cell or the like frequently occurs. At this time, a positron radiates from the positron nuclide of the medicine for inspection. At the time when the positron and an electron in the periphery of the positron are coupled and annihilated, two gamma rays (so-called annihilation gamma rays) are radiated in directions approximately 180 degrees relative to each other. These two gamma rays are simultaneously detected by a radiation detector provided surrounding the subject and an image is regenerated by a computer or the like, so that image data of the distribution of the radioisotopes (RI) of the subject are obtained. Thus, in the PET apparatus, since the functional information about the body of the subject is obtained, it is possible to elucidate the pathology of various intractable diseases.

As shown in FIG. 1, in a PET apparatus 100, gamma ray detectors 101 are provided so as to surround a subject S 360 degrees. The gamma ray detector 101 includes a semiconductor detector 102 and a detection circuit 103. Semiconductor detection devices (not shown in FIG. 1) are provided in the semiconductor detector 102. The detection circuit 103 is configured to electrically detect the gamma rays entering the semiconductor detection devices. In addition, a generating position of the gamma ray is identified based on an output signal indicating that the gamma ray has entered from the detection circuit 103 and position information of the semiconductor detection device indicating where the gamma ray has entered. Furthermore, by detecting multiple gamma rays, an image of the distribution of the medicine for inspection in the subject S is regenerated.

Since the annihilation gamma rays are radiated from the subject in random directions, multiple semiconductor detection devices are arranged in the semiconductor detector 102 so that detection efficiency is improved. For example, as shown in FIG. 2, a radiation detection unit 102 where boards 106 having semiconductor detection devices 105 are provided in a housing 104 has been suggested (see, for example, Patent Document 1).

[Patent Document 1] Japanese Laid-Open Patent Application Publication No. 2005-128000

DISCLOSURE OF THE INVENTION

Problems to be Solved by the Invention

In the meantime, in the PET apparatus, the position where the annihilation gamma ray is generated is identified based on the position information of the corresponding semiconductor detection device. Therefore, if the positional precision of the arrangement of the semiconductor detection devices is degraded, precision of the position information about where the gamma ray is generated is degraded so that spatial resolution may be degraded. In the above-mentioned patent document 1, as shown in FIG. 2, both end parts of the boards 106 of the semiconductor detector 102 are received in and fixed to grooves 109a of guide rails 109 fixed on side walls of the housing 104. Since the guide rails 109 are made of metal or resin, it is difficult to form the grooves 109a with high precision, such limiting errors to less than several hundreds μm. In addition, arrangement errors of the guide rails 109 are generated. Furthermore, since the boards 106 are fixed by engaging side end parts of the boards 106 with the grooves 109a, it is required that the external configuration of the board have good dimensional precision. As a result of this, the cost of the boards 106 is increased. In addition, positioning precision of the semiconductor detection devices 105 onto the board 106 is required.

Thus, there are dimensional errors and positioning errors of the boards 106 or the guide rails 109, so it is difficult to arrange the semiconductor detection devices 105 with high precision.

Means for Solving Problems

Accordingly, embodiments of the present invention may provide a novel and useful radiation detection unit and radiographic inspection apparatus solving one or more of the problems discussed above.

More specifically, the embodiments of the present invention may provide a radiation detection unit where plural semiconductor detection devices are provided with high precision and a radiographic inspection apparatus using the radiation detection unit.

One aspect of the present invention may be to provide a radiation detection unit, including: a plurality of detection boards, the detection board having a wiring board; a semiconductor detection device fixed on an upper surface of the wiring board and configured to detect radiation; and a spacer fixed on the upper surface of the wiring board; and a fixing member configured to fix a built-up body where the plural detection boards are stacked, wherein the plural detection boards are arranged so that the semiconductor detection device and the corresponding spacer have a designated positional relationship; and the spacers have another designated relationship.

According to the embodiments of the present invention, plural detection boards are arranged so that the semiconductor detection device and the corresponding spacer have a designated positional relationship; and the spacers have another designated relationship. Hence, a positional relationship between semiconductor crystal devices arranged on different detecting boards is determined by only the positional relationship between the semiconductor crystal device and the spacer and dimensional precision of the spacer per se. Accordingly, the number of members for which high positioning precision is require in order to arrange semiconductor crystal devices is small, and there is a reduction in the number of the members requiring high dimensional precision. Therefore, it is possible to easily obtain high precision so that plural semiconductor detection devices with high precision can be realized.

The embodiments of the present invention may also provide a radiographic inspection apparatus, including: a radiation detection unit configured to detect radiation generated from a subject including a radioisotope, a detection circuit unit connected to the radiation detection unit; and an information processing part configured to process information about distribution in the subject of the radioisotope based on detected information including an entry time and an entry position of radiation obtained by the detection circuit unit.

According to the embodiments of the present invention, since plural semiconductor detection devices of the radiation detection unit are arranged with high precision, spatial resolution is improved so that inspection with high precision can be achieved.

EFFECT OF THE INVENTION

According to the embodiment of the present invention, it is possible to provide a radiation detection unit where plural semiconductor detection devices are provided with high precision and a radiographic inspection apparatus using the radiation detection unit. Other objects, features, and advantages of the present invention will become more apparent from the following detailed description when read in conjunction with the accompanying drawings.

BRIEF DESCRIPTION OF DRAWINGS

FIG. 14 is a second view of the manufacturing steps of the semiconductor detection unit;

EXPLANATION OF REFERENCE SIGNS

Figure 1:
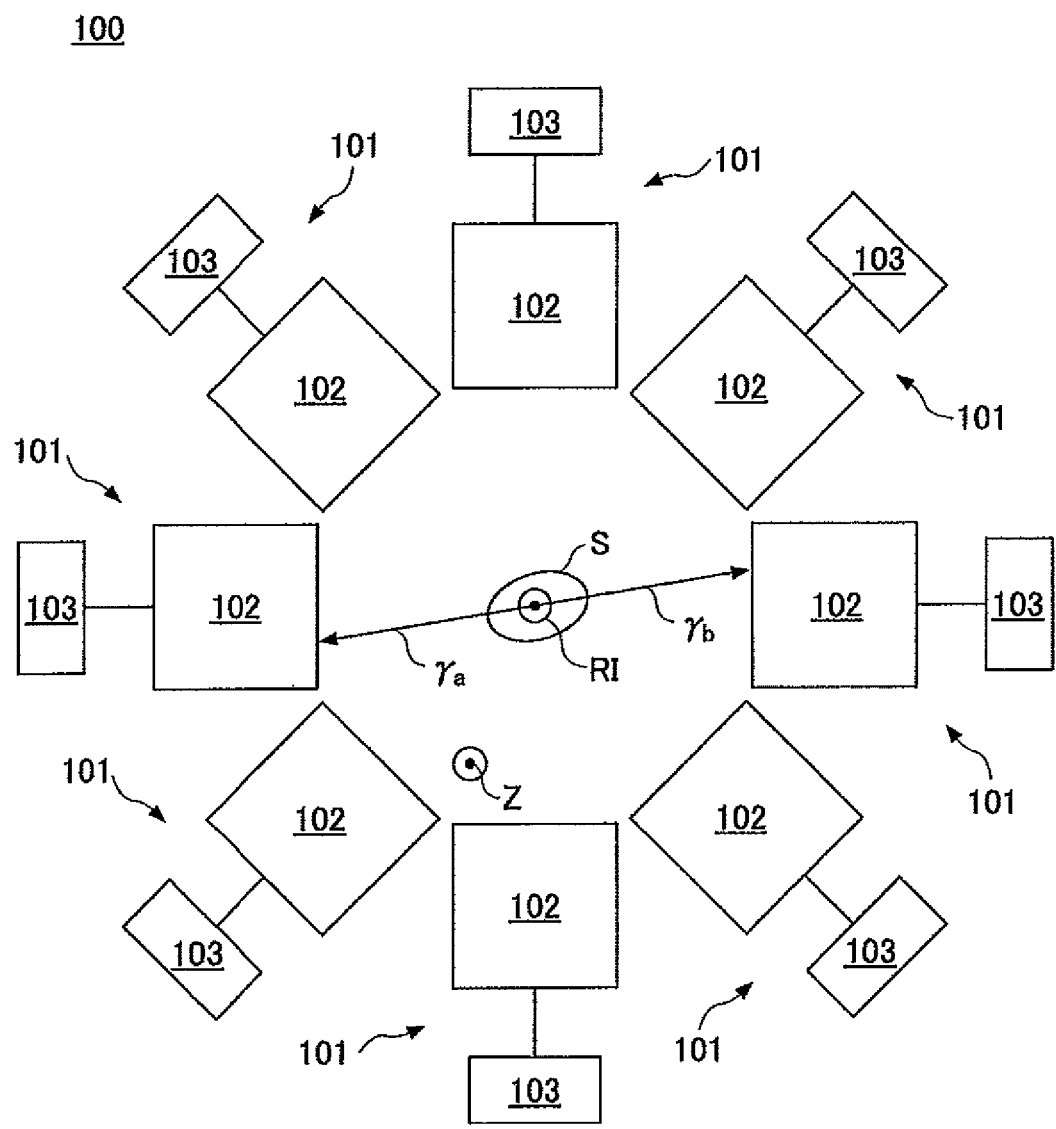
FIG. 1 is a schematic structural view of a PET apparatus.

10 PET apparatus
11 and $11_1$ through $11_8$ detector
12 information processing part
13 display part
14 control part
15 input and output part
16 detection circuit unit
20, 40, 45, 50, 60 semiconductor detection unit
21 supporting base
22 detecting board
23 fixing member
23a bolt
23b nut
24, 64 wiring board
24a wiring pattern
25 semiconductor detection device
26 connector
28, 41, 46, 52, 68 spacer
28A base part
28B, 41B, 46B, 68B arm part
28c, 52c lower surface
28d, 52c upper surface
28e, 52e step part
28f arm part head end surface
28g step part side surface
29 flexible printed wiring board (FPC)
30 semiconductor crystalline substrate
31 first electrode part
32 second electrode part
33 conductive adhesion layer
35, 54 adhesive layer

BEST MODE FOR CARRYING OUT THE INVENTION

A description is given below, with reference to FIG. 3 through FIG. 19, of embodiments of the present invention.

Figure 3:
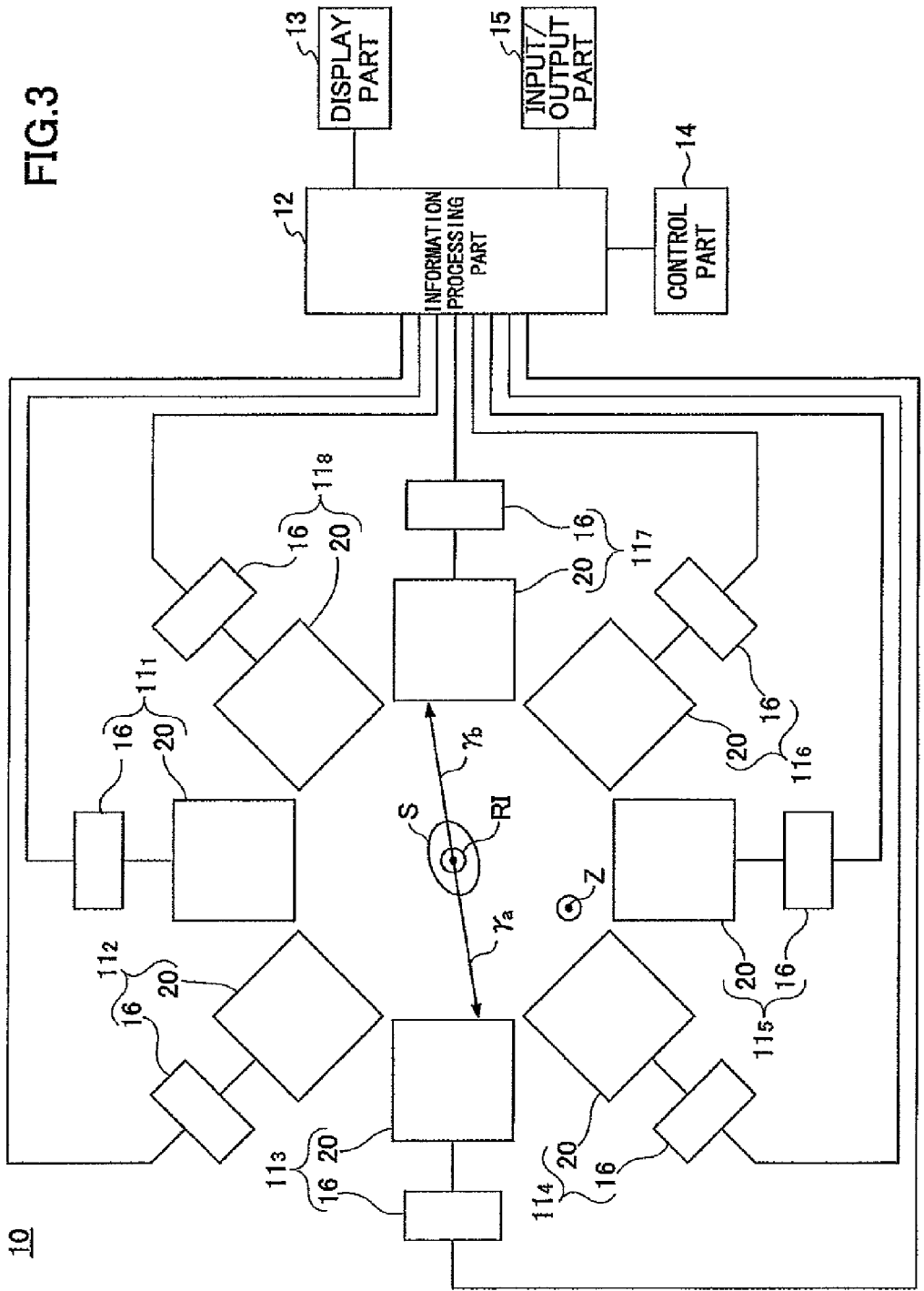
FIG. 3 is a block diagram showing a structure of a PET apparatus of an embodiment of the present invention.

FIG. 3 is a block diagram showing a structure of a PET apparatus of the embodiment of the present invention. As shown in FIG. 3, a PET apparatus 10 includes detectors 11, an information processing part 12, a display part 13, a control part 14, an input/output part 15, and others. The detectors 11 are provided surrounding a subject S and configured to detect gamma rays. The information processing part 12 is configured to process detected data from the detectors 11 and regenerate image data of a position of positron nuclide RI in a body of the subject. The display part 13 is configured to display the image data and others. The control part 14 is configured to control movement of the detectors 11 and the subject S and others. The input/output part 15 is, for example, a terminal configured to transmit instructions to the image processing part 12 or the control part 14, or a printer configured to output the image data.

Figure 2:
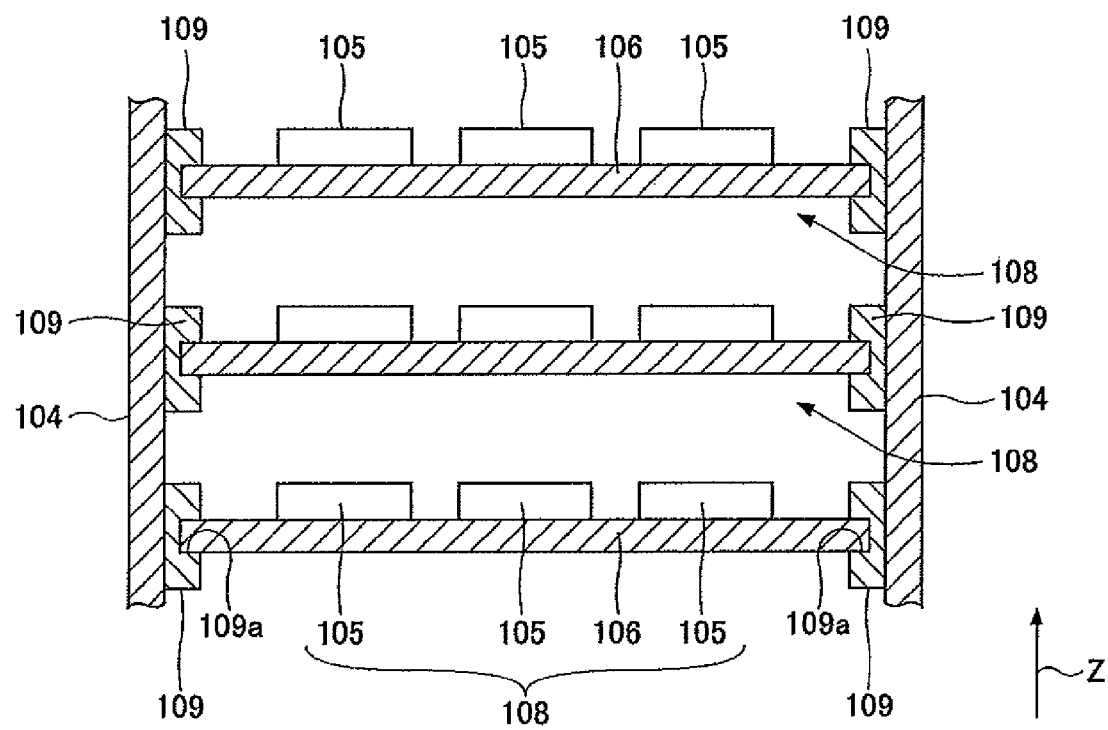
FIG. 2 is a cross-sectional view of a conventional semiconductor detection unit for explaining problems of the conventional semiconductor detection unit.

The detectors $11_1$ through $11_8$ are arranged 360 degrees around the subject S. Here, an axial direction of the subject S is defined as a Z-axial direction (Z and −Z directions). The detector 11 may be provided so as to move in the Z-axial direction relatively to the subject S. While eight detectors $11_1$ through $11_8$ are shown in FIG. 2, the present invention is not limited to this. The number of the detectors 11 can be properly selected.

The detectors 11 include semiconductor detecting units 20 and detection circuit units 16. A medicine for inspection identified in advance by a positron nuclide RI is introduced in the subject S. The semiconductor detecting units 20 are provided so that surfaces where the gamma rays enter facing toward the subject S.

When positron generated from the positron nuclide RI is annihilated, two gamma rays $\gamma_a$ and $\gamma_b$ are simultaneously generated. Since two gamma rays $\gamma_a$ and $\gamma_b$ are radiated so as to form substantially 180 degrees relative to each other, the gamma rays $\gamma_a$ and $\gamma_b$ enter semiconductor detecting elements (indicated by a numerical reference 25 in FIG. 4) of the semiconductor detecting units 20 of the detectors 11 facing each other via the subject S. Each of the semiconductor detecting units 20 where one of the gamma rays $\gamma_a$ and $\gamma_b$ enter transmits an electric signal (detection signal) generated by entry of the one of the gamma rays $\gamma_a$ and $\gamma_b$ to the corresponding detection circuit unit 16.

The detection circuit unit 16 includes a detection circuit (not shown). The detection circuit unit 16 is configured to determine a time (entry time) when the one of the gamma rays $\gamma_a$ and $\gamma_b$ enters the detecting element based on the detection signal supplied from the semiconductor detecting unit 20. In addition, the detection circuit unit 16 transmits detected data such as entry time and entry position information (identifying number of the element detecting the gamma ray and others) to the information processing part 12. The detection circuit of the detection circuit unit 16 is formed by a mixed circuit of an analog circuit and a digital circuit.

The information processing part 12 is configured, based on the detected data, to regenerate image data by detection of coincidence and use of an image regenerating algorithm. In the detection of the coincidence, if there are two or more detected data elements whose entry times are substantially the same, the detected data are determined as valid data so as to be regarded as coincident data. If the gamma rays entry times are not the same, the detected data elements are determined as invalid data so as to be destroyed. In addition, the image data are regenerated from the coincident information, a detection element number or the like included in the coincidence information, the position information of the detection element corresponding to this, and others, based on an image regenerating algorithm such as an expectation maximization method. The display part 13 is configured to display the image data regenerated based on a request of the input/output part 15.

With the above-mentioned structure and operation, the PET apparatus 10 detects gamma rays from the positron nuclide RI selectively positioned in the body of the subject 8 so as to regenerate the image data of the positron nuclide RI distribution.

Figure 4:
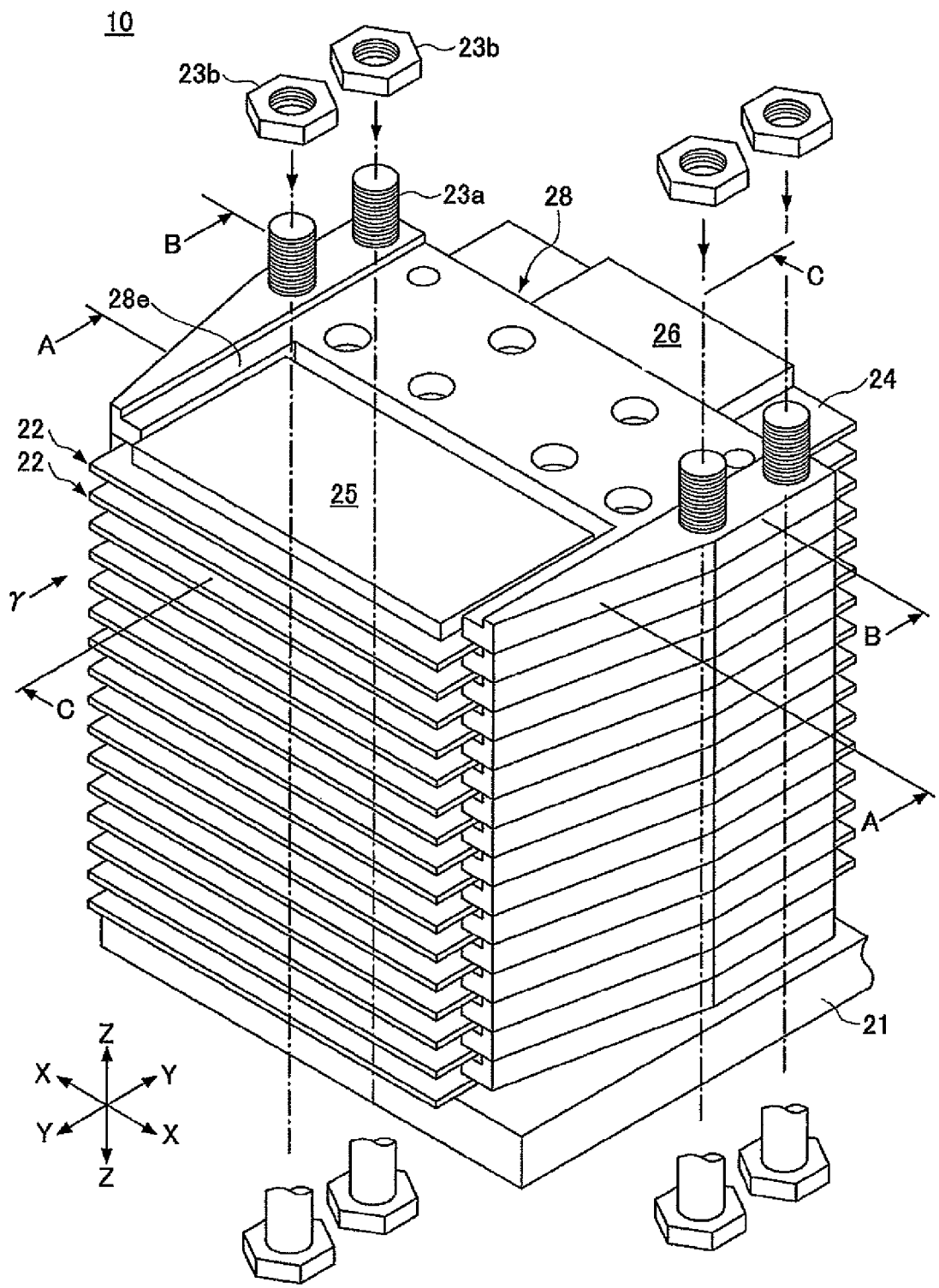
FIG. 4 is a perspective view of a semiconductor detection unit of the embodiment of the present invention.

FIG. 4 is a perspective view of the semiconductor detection unit 20 of the embodiment of the present invention. In other words, FIG. 4 is a view seen in an entry direction of the gamma rays, that is, from a front surface of the semiconductor detection unit.

As shown in FIG. 4, the semiconductor detection unit 20 is a built-up body where plural detection boards 22 are stacked on the supporting base 21. The built-up body is fixed in upper and lower directions by the fixing member 23 formed by four bolts 23a and four nuts 23b. A case where sixteen detection boards 22 are provided is shown in the example of FIG. 4. The detection board 22 is formed by the wiring board 24, the semiconductor detection device 25, the connector 26, the spacer 28, and others. The spacers 28 of adjacent upper and lower detection boards 22 come in contact with each other so that the upper and lower detection boards 22 are stacked. The gamma rays radiated from the subject S enter the semiconductor detection device 25 so as to be converted to an electric signal. The electric signal is output from the connector 26 to the detection circuit board of the detection circuit unit indicated by a numerical reference 16 in FIG. 3 via the flexible printed wiring board (FPC) 29 and others.

Figure 5:
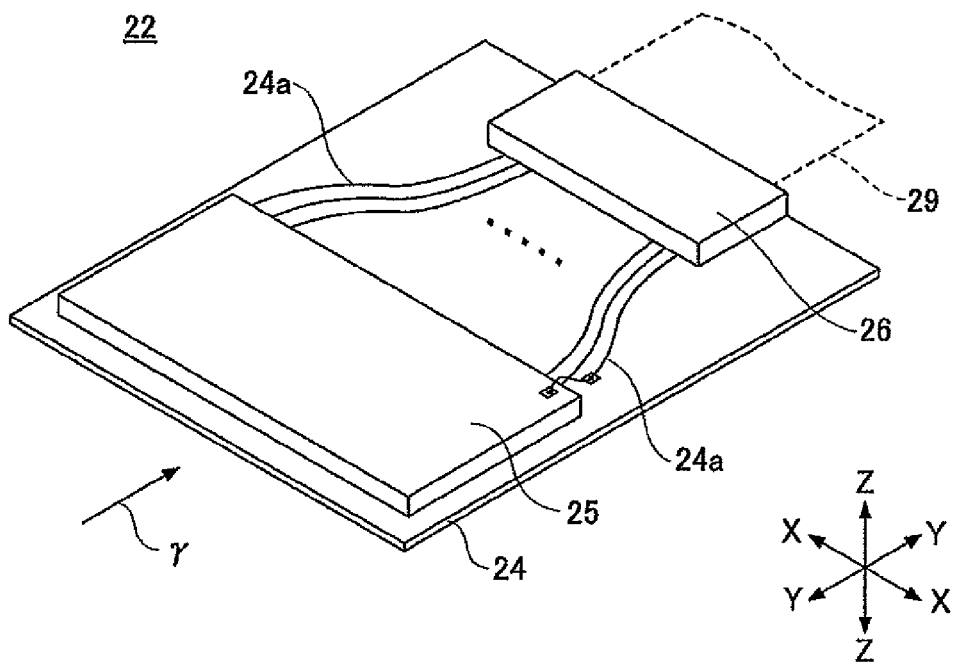
FIG. 5 is a perspective view of a detection board.

FIG. 5 is a perspective view of the detection board 22. For the convenience of explanation, illustration of the spacer 28 is omitted in FIG. 5.

As shown in FIG. 5, in the detection board 22, the semiconductor detection device 25 and the connector 26 are fixed on the wiring board 24. The wiring board 24 may be made of glass epoxy, polyimide, or the like. The semiconductor detection device 25 and the connector 26 are electrically connected to each other by the wiring patterns 24a provided on the wiring board 24. There is no limitation of the type of the connector 26. For example, a connector for a flat cable, where a flexible printed wiring board (FPC) or the like can be connected, can be used as the connector 26.

Figure 6:
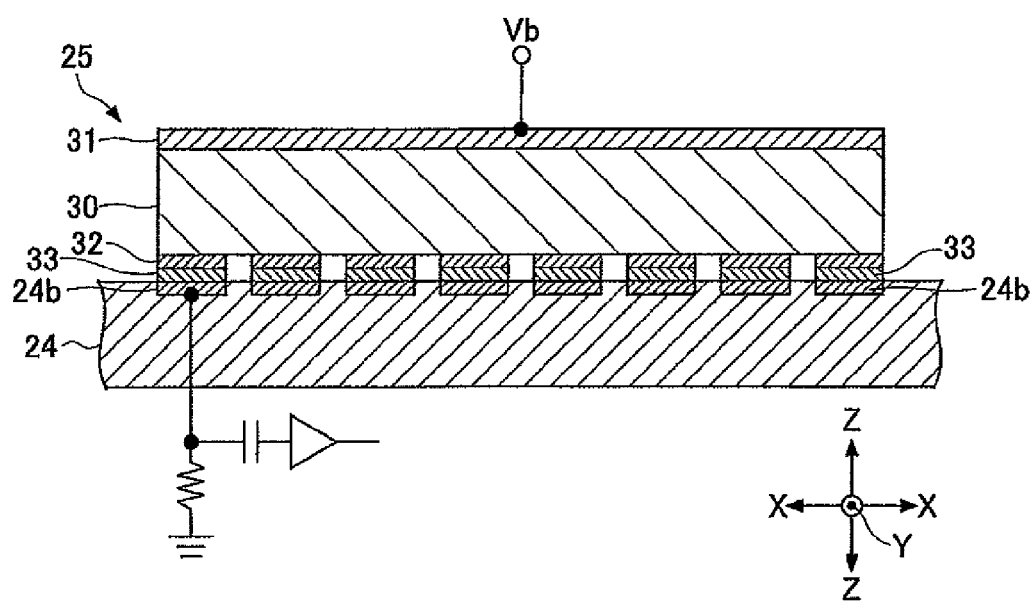
FIG. 6 is a schematic cross-sectional view of a semiconductor detection device.

FIG. 6 is a schematic cross-sectional view of the semiconductor detection device 25. As shown in FIG. 6, the semiconductor detection device 25 is formed by a substantially plate shaped semiconductor crystalline substrate 30, a first electrode part 31, second electrode parts 32, and others. The first electrode part 31 is formed on an upper surface of the semiconductor crystalline substrate 30. The electrode parts 32 are formed on the lower surface of the semiconductor crystalline substrate 30.

The semiconductor crystalline substrate 30 is made of, for example, cadmium telluride (CdTe) which is sensitive to gamma rays having energies of 511 keV, $Cd_{1-x}Zn_xTe$ (CZT), thallium bromide (TlBr), silicon, or the like. A dopant for controlling conductivity or the like may be included in these materials. Silicon is preferable as a material of the semiconductor crystalline substrate 30 because silicon has a higher mechanical strength than CdTe and crystal defect may not be formed in silicon during a processing. Semiconductor crystal is formed by a Bridgman method which is a crystal growth method of the semiconductor or a moving heating method and the semiconductor crystal is cut in a designated crystal orientation and in a plane plate manner so that the semiconductor crystalline substrate 30 is obtained.

The first electrode part 31 is made of a conductive film which substantially covers the upper surface of the semiconductor crystalline substrate 30. A negative bias voltage Vb is applied to the first electrode part 31 so that the first electrode part 31 becomes a cathode. In a case where the semiconductor crystalline substrate 30 is made of CdTe, the first electrode part 31 is made of, for example, platinum (Pt). The bias voltage Vb is, for example, −60 V through −100 V DC.

The second electrode parts 32 are provided on the lower surface of the semiconductor crystalline substrate 30 so as to extend in a Y-axial direction. The second electrode parts 32 are made of plural conductive films separated from neighboring electrodes with a designated width in an x-axial direction. If the semiconductor crystalline substrate 30 is made of CdTe, the second electrode parts 32, for example made of gold (Au) and indium (In), are supplied and diffused to the second electrode part 32 side of the semiconductor crystalline substrate 30. Because of this, a Schottky barrier junction is formed between the second electrode parts 32 and the CdTe. A conductive film of each second electrode part 32 is fixed to the corresponding electrode 24b provided on the wiring board 24 via a conductive adhesion layer 33 such as a conductive paste or an anisotropic conductive adhesive. The electrode 24b is connected to a wiring pattern indicated by a numerical reference 24a shown in FIG. 5 and connected to an electrical ground via a resistance. Hence, the second electrode part 32 is an anode. The electrode 24b is connected to a preamp of the detection circuit of the detection circuit unit 16 via a condenser. In an example shown in FIG. 6, a single circuit connected to the second electrode part 32 is indicated and illustrations of circuits connected to other second electrode parts 32 are omitted.

Next, operations of the semiconductor device 25 are discussed. When the gamma rays enter the semiconductor crystalline substrate 30, an electron-hole pair is formed stochastically. Since an electrical field is applied from the second electrode part 32 toward the first electrode part 31 in the semiconductor crystalline substrate 30, the electron-hole pair is attracted to the second electrode part 32 so that an output signal is transmitted to the detection circuit of the detection circuit unit 16.

Figure 7:
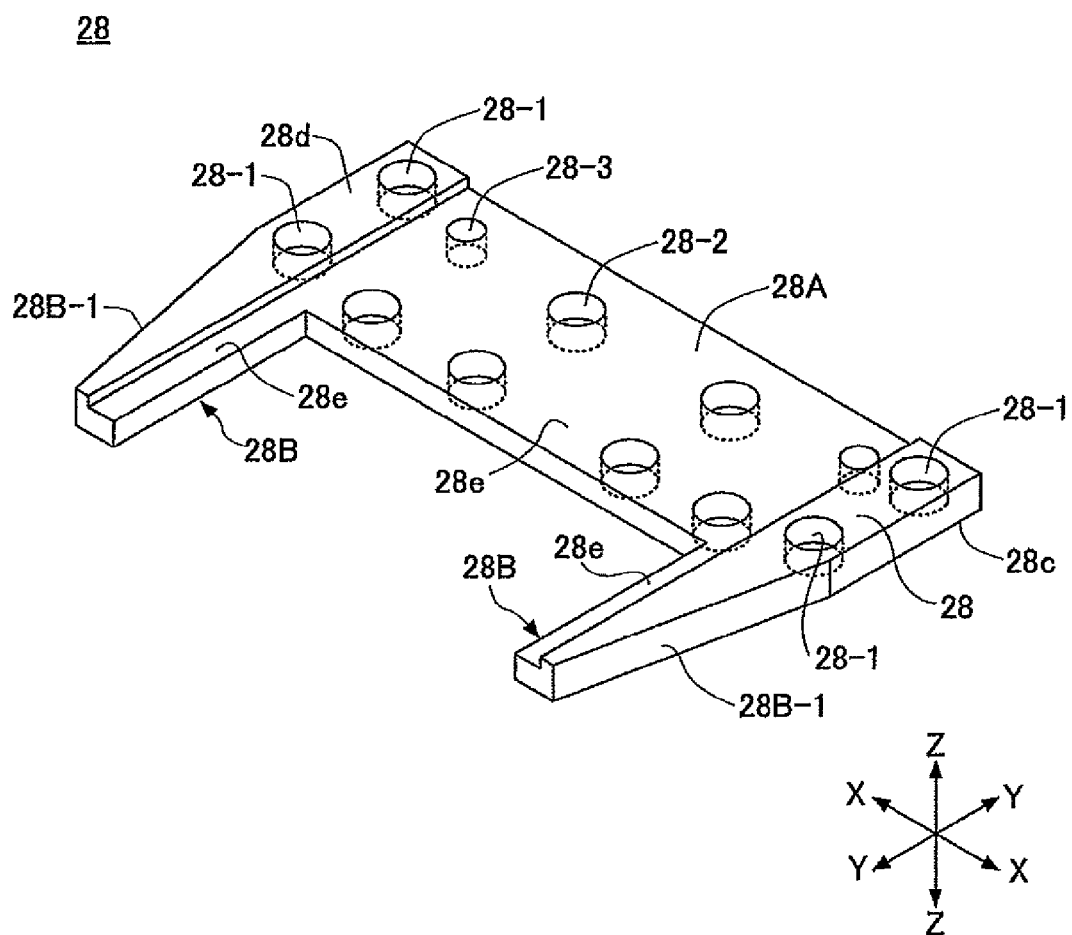
FIG. 7 is a perspective view of a spacer.

FIG. 7 is a perspective view of the spacer 28. As shown in FIG. 7 and FIG. 4, the spacer 28 includes a base part 28A and a couple of arm parts 28B. The plane plate shaped base part 28A extends in the X-axial direction. The arm parts 28B are provided at both side parts in the X-axial direction of the base part 28A and extend in the Y-axial direction, namely an entry direction of the gamma rays. In the spacer 28, a space opening to the gamma rays entry side is formed by the base part 28A and the arm parts 28B. The semiconductor detection device 25 is received in the space when the spacer 28 is fixed to the wiring board 24. This space is greater in size than the semiconductor detection device 25 and therefore the semiconductor detection device 25 and the spacer 28 are prevented from contacting each other. Because of this, it is possible to easily position the semiconductor detection device 25, compared to a case where the semiconductor detection device 25 and the spacer 28 contact each other.

The spacer 28 has a plane lower surface 28c. In addition, the spacer 28 has an upper surface 28d situated in the highest position and a step part 28e situated in a position lower than the upper surface 28d. The upper surface 28d of the spacer 28 is a plane surface. A position in upper and lower directions of the detection board 22 is defined by the upper surface 28d and the lower surface 28c.

Figure 8:
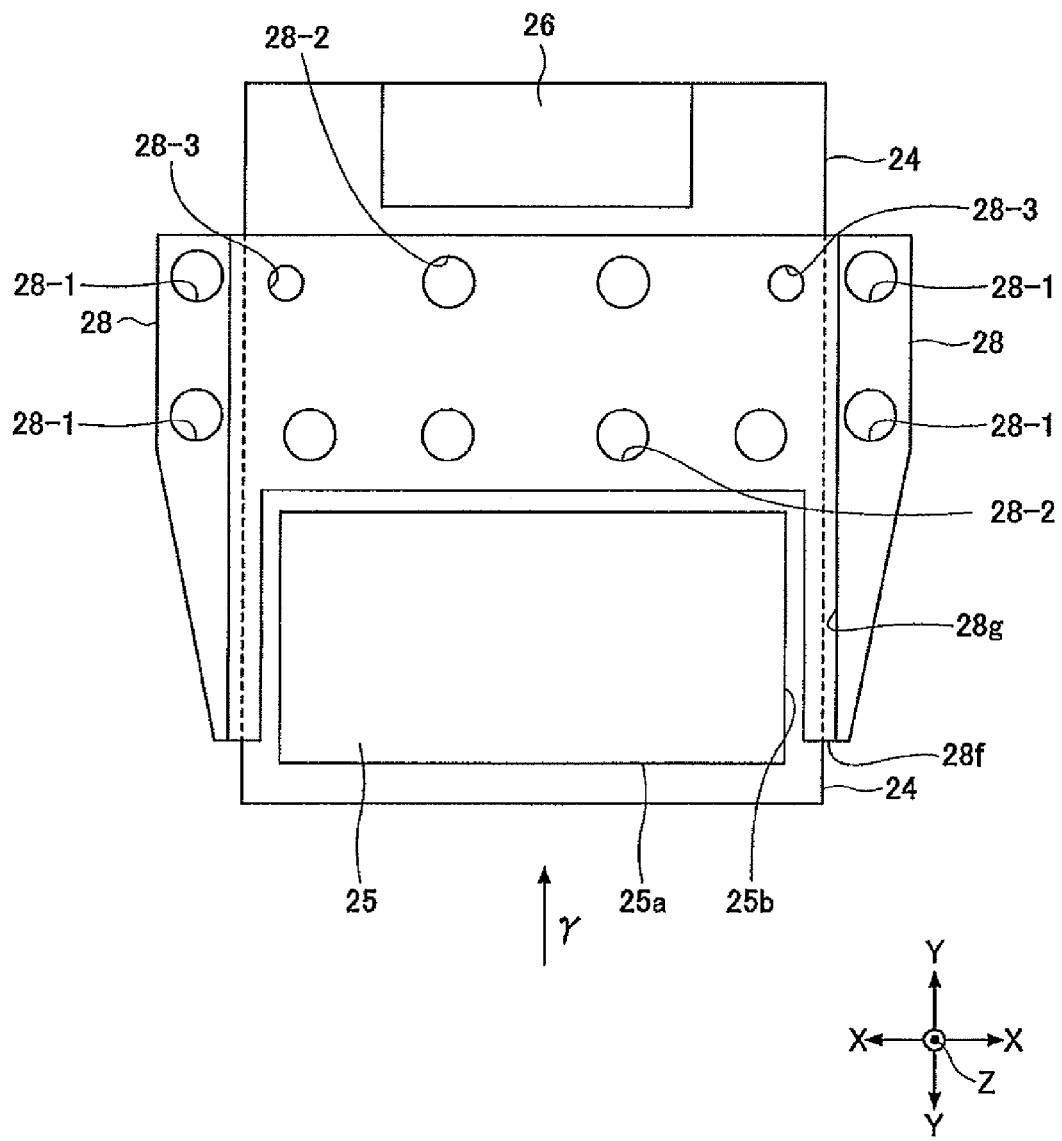
FIG. 8 is a plan view of the semiconductor detection unit shown in FIG. 4.

The step part 28e extends in the Y-axial direction of the spacer 28. As shown in FIG. 8 and FIG. 4, the step part 28e is provided so that contact between the spacer 28 and the wiring board 24 of the detection board 22 stacked on the spacer 28 is prevented.

Opening parts 28-1 through 28-3 are provided so as to pierce the spacer 28 in the thickness direction of the spacer 28. Two opening parts 28-1 are provided at each side in the X-axial direction of the base part 28A. Bolts 23a configured to fix the semiconductor detection unit 20 are inserted in the opening parts 28-1. Internal diameters of the opening parts 28-1 are greater than the diameters of the bolts 23a. Although two opening parts 28-1 are provided at each side in the X-axial direction of the base part 28A, there is no limitation of the number of the opening parts 28-1. A single or three or more opening parts 28-1 may be provided. In addition, the openings 28-2 and 28-3 are provided so that adhesives for fixing the spacer 28 and the wiring board 24 shown in FIG. 4 are introduced in the openings 28-2 and 28-3. There is no limitation of the number of the opening parts 28-2 and 28-3. It is not always necessary to provide the opening parts 28-2 and 28-3.

There is no limitation of a material of the spacer 28 as long as the material has a coefficient of elasticity so that the spacer 28 is not deformed due to a clamping force in upper and lower directions at the time when the semiconductor detection unit 20 is fixed. The material of the spacer 28 is selected from, for example, metal (alloy), a ceramic material, and others. It is preferable that the spacer 28 be made of ceramic material. In a case where ceramic material is used as the material of the spacer 28, the spacer 28 is molded by a casting mold and the upper surface 28d and the lower surface 28c are polished with high precision. In the case of the ceramic material, high surface smoothness with high dimensional precision is obtained by the polishing process. Hence, high dimensional precision of the spacer 28 can be obtained. Although it is relatively difficult to polish the step part 28e compared to the upper surface 28d and the lower surface 28c, the precision of the surface evenness or dimensional of the step part 28e may be lower than that of the upper surface 28d or the lower surface 28c. Hence, it is easy to manufacture the spacer 28.

Furthermore, each of the arm parts 28B of the spacer 28 has a taper configuration where an outside edge 28B-1 is gradually tapered toward the inside in a Y-axial direction (a side of the subject in the gamma-ray entry direction). As discussed below, the semiconductor detection units 20 can be provided close-packed by arranging the outside edges 28-1 of the arm parts 28B-1 close to each other.

FIG. 8 is a plan view of the semiconductor detection unit 20 shown in FIG. 4. As shown in FIG. 8, the detection boards 22 are arranged so that the semiconductor detection device 25 and the spacer 28 have a designated positional relationship. The designated positional relationship is, for example, distance and parallelization degree between a border in an X-axial direction of an external configuration of the semiconductor detection device 25 and an arm part head end surface 28f of the spacer 28 and distance and parallelization degree between a border in a Y-axial direction of an external configuration of the semiconductor detection device 25 and an arm part head end surface 28g of the spacer 28f. By setting the designated positional relationships, the positional relationship between the semiconductor detection device 25 and the spacer 28 on an X-Y surface is determined.

Figure 9:
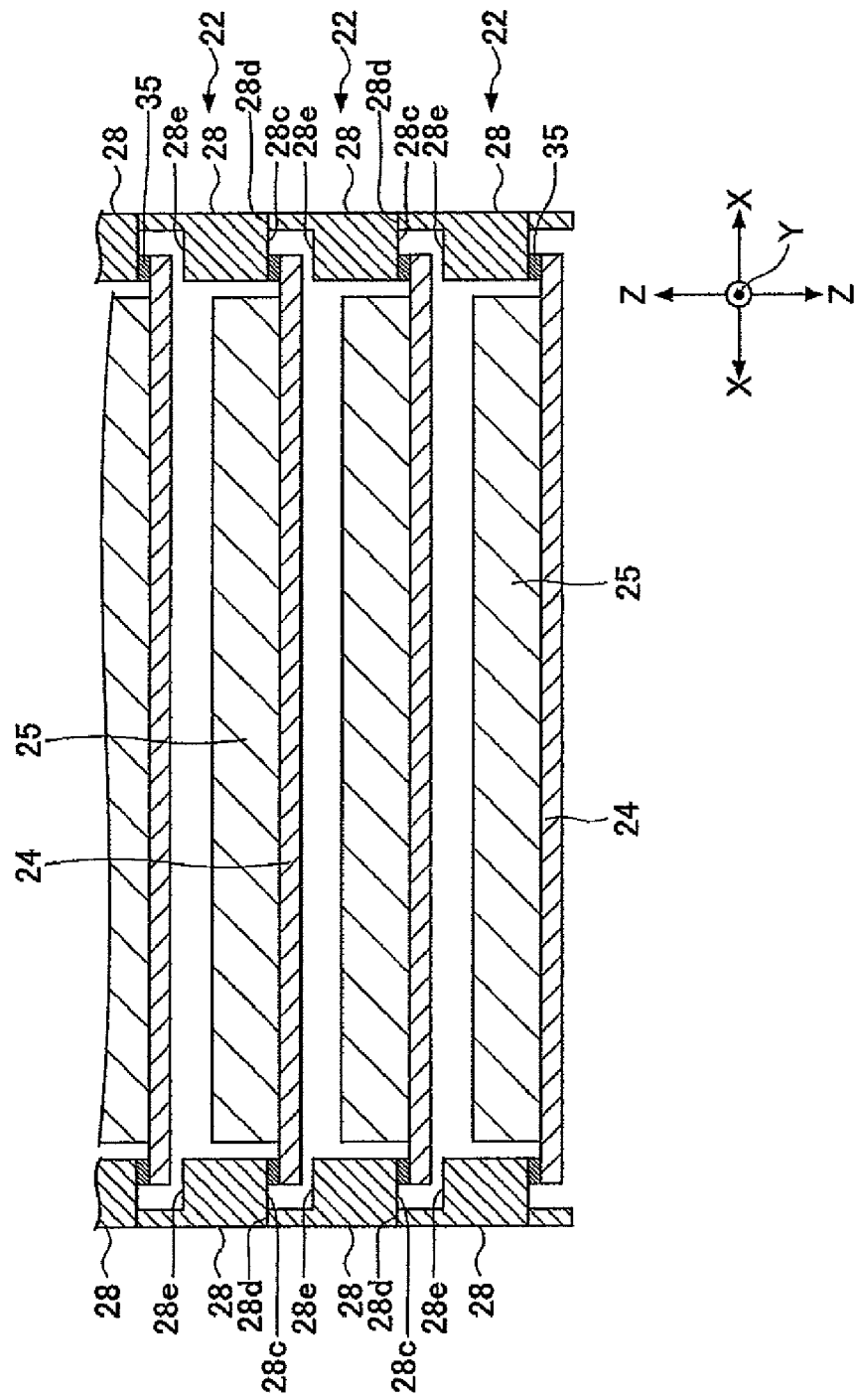
FIG. 9 is a schematic cross-sectional view of the semiconductor detection unit shown in FIG. 4 taken along a line A-A.
Figure 10:
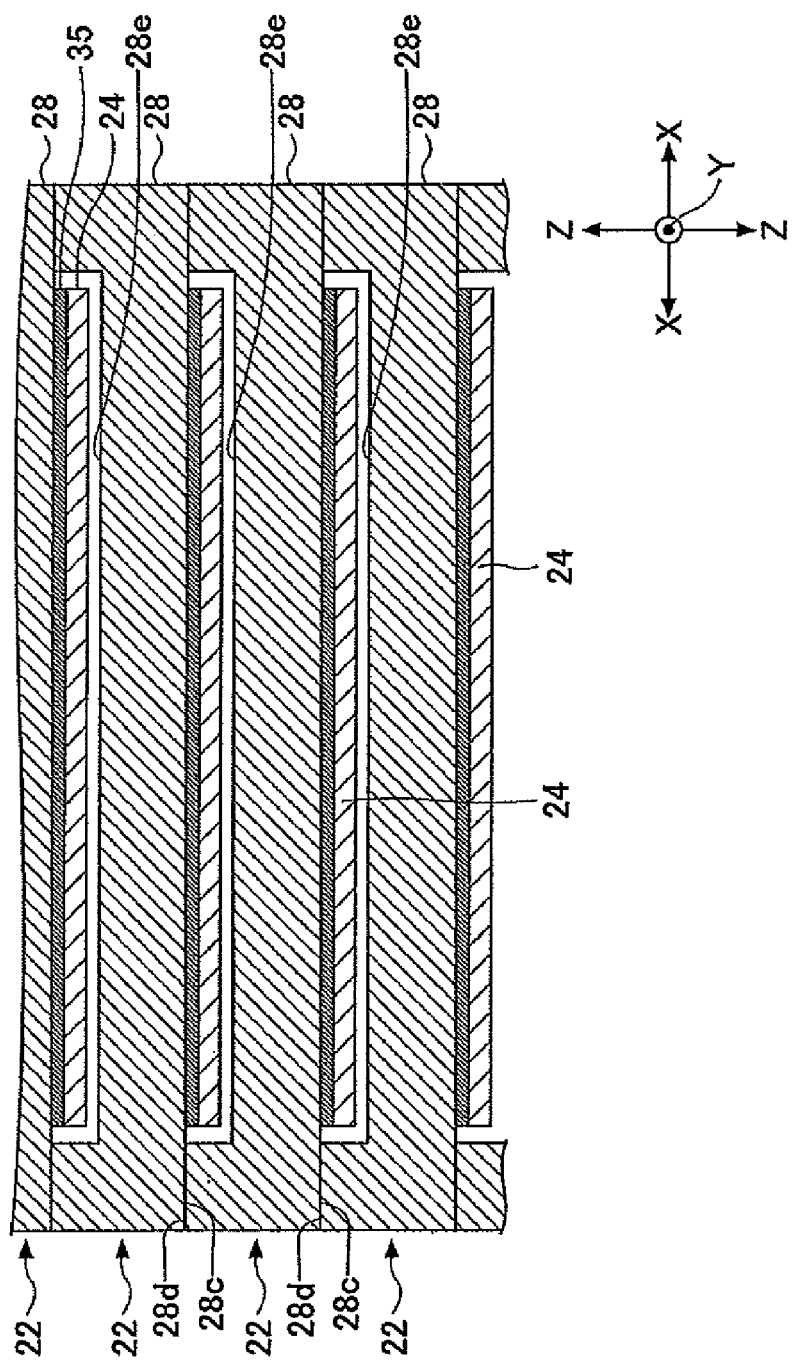
FIG. 10 is a schematic cross-sectional view of the semiconductor detection unit shown in FIG. 4 taken along a line B-B.
Figure 11:
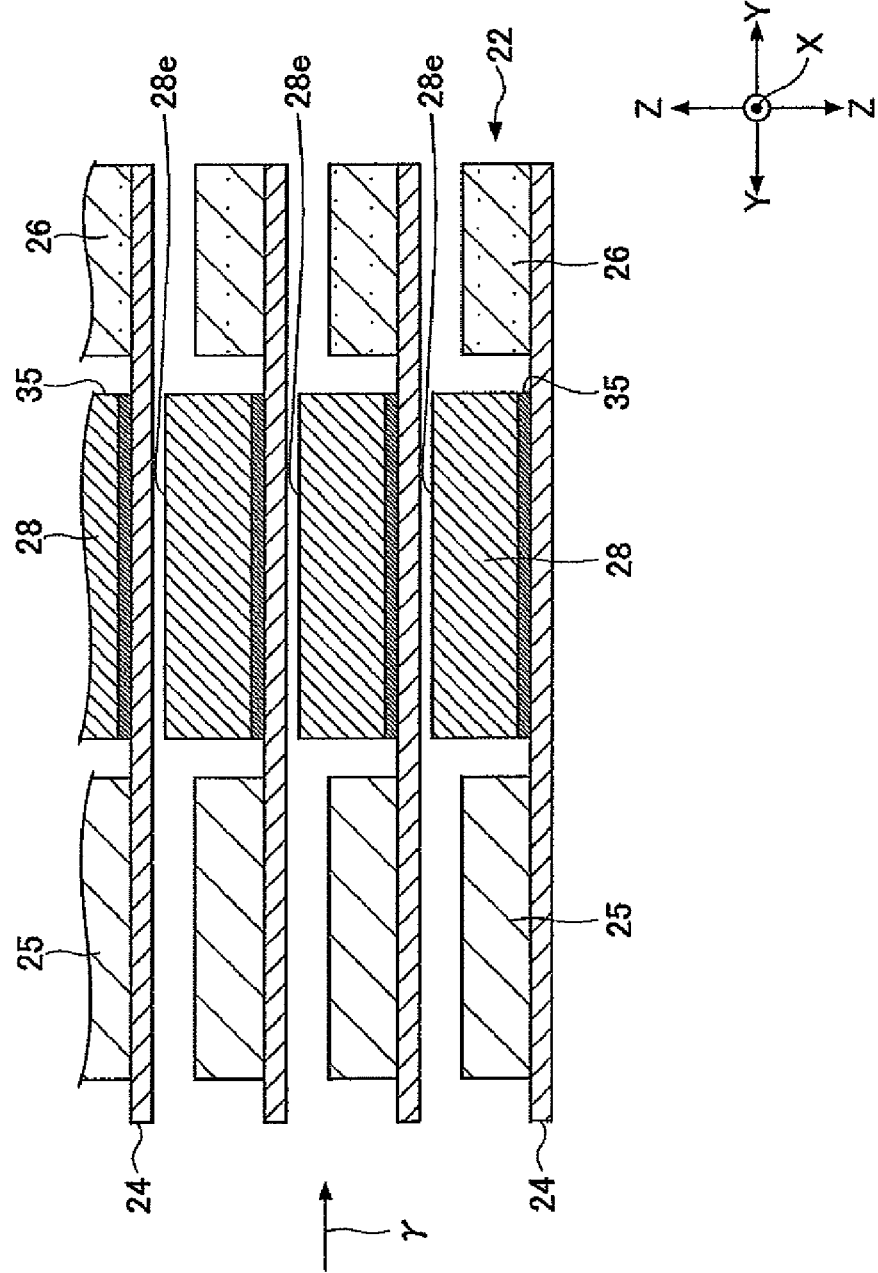
FIG. 11 is a schematic cross-sectional view of the semiconductor detection unit shown in FIG. 4 taken along a line C-C.

FIG. 9 is a schematic cross-sectional view of the semiconductor detection unit 20 shown in FIG. 4 taken along a line A-A. FIG. 10 is a schematic cross-sectional view of the semiconductor detection unit 20 shown in FIG. 4 taken along a line B-B. FIG. 11 is a schematic cross-sectional view of the semiconductor detection unit 20 shown in FIG. 4 taken along a line C-C.

As shown in FIG. 9 through FIG. 11, the upper and lower detection boards 22 are stacked so that only the spacers 28 of the adjacent upper and lower detection boards 22 come in contact with each other. In other words, a lower surface 28c of a spacer 28 of an upper detection board 22 comes in contact with an upper surface 28d of a spacer 28 of a lower detection board 22. A lower surface of the wiring board 24 of the upper detection board 22 does not come in contact with the upper surface of the lower detection board 22 because of a step part 28e provided at a lower spacer 28. As a result of this, the positional relationship in the upper and lower direction of the detection boards 22 is determined by the distance between the upper surface 28d and the lower surface 28c of the spacer 28, namely only the thickness of the spacer 28.

In each of the detection boards 22, the upper surface of the wiring board 24 is fixed to the lower surface 28c of the spacer 28 via the adhesive layer 35. In other words, the position in the Z-axial direction of the semiconductor detection element 25 is determined based on the lower surface 28c of the spacer 28 as a reference point. The position in the Z-axial direction of the detection board 22 is also determined by the lower surface 28c of the spacer 28. Hence, the position in the Z-axial direction of the semiconductor detection device 25 is determined by the spacer 28. Only thickness in the spacer 28 need be formed with high precision. Since the thickness precision of the spacer 28 can be easily controlled, the position in the Z-axial direction of the semiconductor detection element 25 can be set with high precision. In addition, the spacers 28 come in contact with each other by only areas of both side parts in the X-axial direction of the arm part 28B and the base part 28A. Hence, the positioning precision of the spacers 28 is improved.

The adhesive 35 is formed between the lower surface 28c of the spacer 28 and the upper surface of the wiring board 24 so that the spacer 28 and the wiring board 24 are fixed to each other. Although there is no limitation of the material of the adhesive layer 35, epoxy resin, for example, can be used as the material of the adhesive layer 35. The thickness of the adhesive layer 35 is, for example, 20 μm and extremely thinner than a gap between upper and lower detection boards 22. Hence, the thickness of the adhesive layer 35 does not influence the positioning precision. In FIG. 9 through FIG. 11, the thickness of the adhesive layers 35 is illustrated magnified compared to those of other members.

The spacers 28 may be fixed to each other by introducing the adhesive into the opening parts 28-2 and 28-3 shown in FIG. 8. As a result of this, the adhesive layer 35 can be thinner such as 0 (zero).

Figure 12:
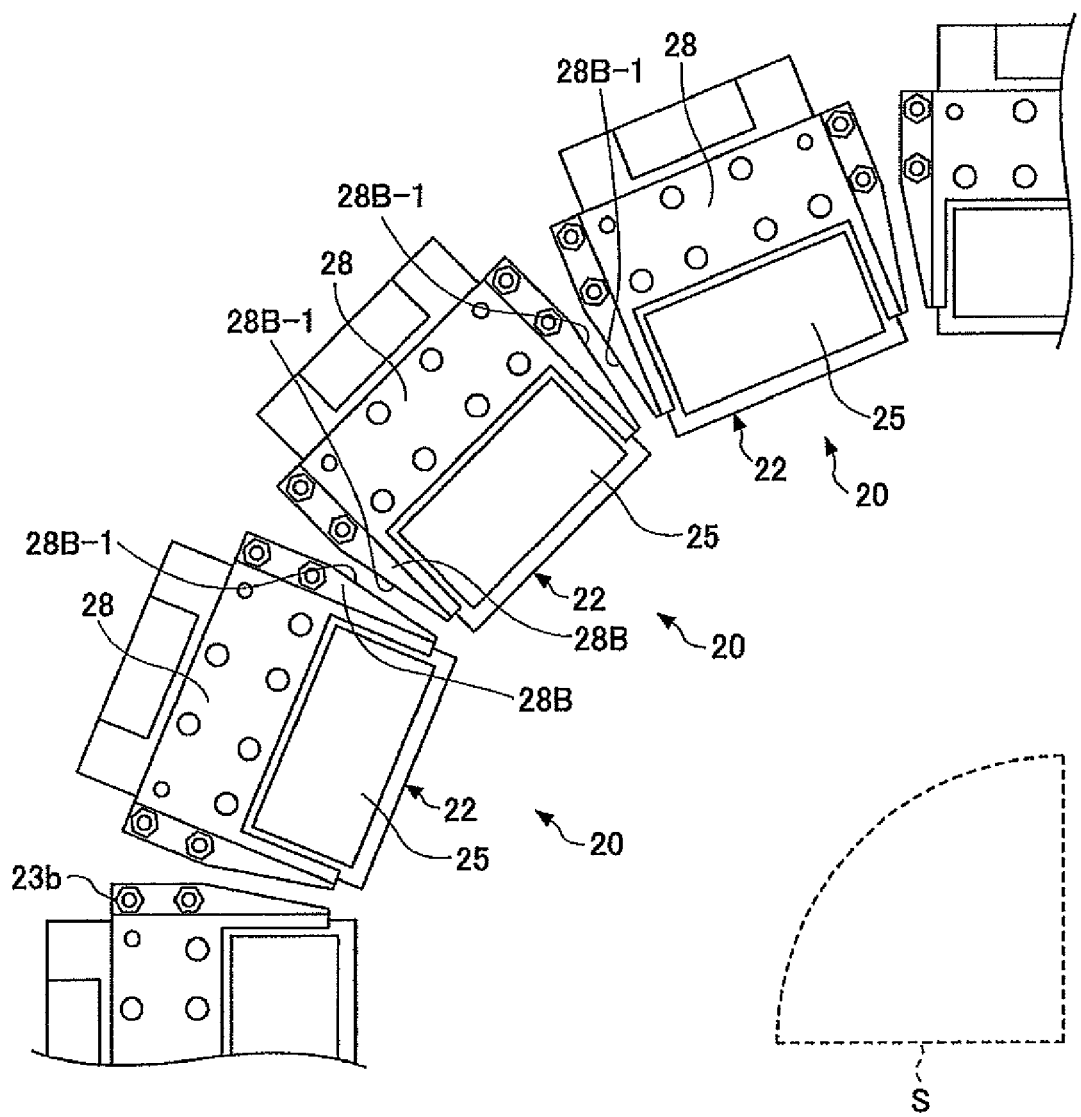
FIG. 12 is a view showing arrangement of the semiconductor detection units shown in FIG. 4 of the PET apparatus.

FIG. 12 is a view showing the arrangement of the semiconductor detection units 20 shown in FIG. 4 of the PET apparatus 10. In the PET apparatus 10, the semiconductor detection units 20 are arranged on a surface perpendicular to the body axis of the subject S. FIG. 12 is a view seen in the body axial direction (plan view).

As shown in FIG. 12, the semiconductor detection units 20 are arranged so that the subject S is surrounded by the semiconductor detection devices 25. The arm parts 28B of the spacers 28 of the neighboring semiconductor detection units 20 are close to each other. The arm part 28B of one semiconductor detection unit 20 is substantially parallel to the arm part 28B of a neighboring semiconductor detection unit 20. The arm parts 28B of a spacer 28 have a taper configuration where an outside edge 28B-1 is gradually tapered toward the inside in a Y-axial direction (a side of the subject in the gamma-ray entry direction). Hence, it is possible to closely arrange the neighboring semiconductor detection units 20. As a result of this, the distance between the neighboring semiconductor detection devices 25 can be shortened so that the gamma rays going out between the semiconductor detection devices 25 and not detected can be reduced. Therefore, it is possible to improve detection efficiency of the PET apparatus. Furthermore, by properly selecting a taper angle of the outside edge 28-1, it is possible to arrange the semiconductor detection units 20 in a circumferential direction of the subject S where the body axis of the subject S is a center.

According to the embodiment of the present invention, the positional relationship of the semiconductor detection devices 25 provided on the different detection boards 22 of the semiconductor detection unit 20 is determined by the positional relationship of the semiconductor detection device 25 and the spacer 28 of each detection board 22 and by dimensional precision of the spacer 28 per se. Therefore, members for which precision is required in order to arrange the semiconductor detection devices 25 with high precision are only the semiconductor detection device 25 and the spacers 28. In other words, the number of the members for which precision is required is small. In addition, dimensions whose precision is required for these members are the external configuration of the semiconductor detection devices 25, parts indicated by numerical references 28g and 28f in FIG. 8 for positioning the spacer 28, and the thickness of the spacer 28. Accordingly, since the dimensions whose precision is required are limited, it is possible to easily obtain good precision. Hence, it is possible to arrange plural semiconductor detection devices 25 of the semiconductor detection unit 20 with high precision.

In addition, the lower surface 28c and the upper surface 28d of the spacer 28 are plane. Hence, even if the spacer 28 is formed of ceramic having high mechanical strength, it is possible to control thickness with high precision and provide high surface evenness by a mechanical polishing method. Accordingly, it is possible to easily obtain high dimensional precision of the spacer 28 and make the spacer 28 thin. Hence, the distance between the upper and lower semiconductor detection devices 25 of the semiconductor detection unit 20 can be shortened so that detection error can be reduced and detection efficiency can be improved. In addition, it is possible to make the size of the semiconductor detection unit 20 small.

Next, a manufacturing method of the semiconductor detection unit 20 is discussed with reference to FIG. 13 and FIG. 14.

Figure 13:
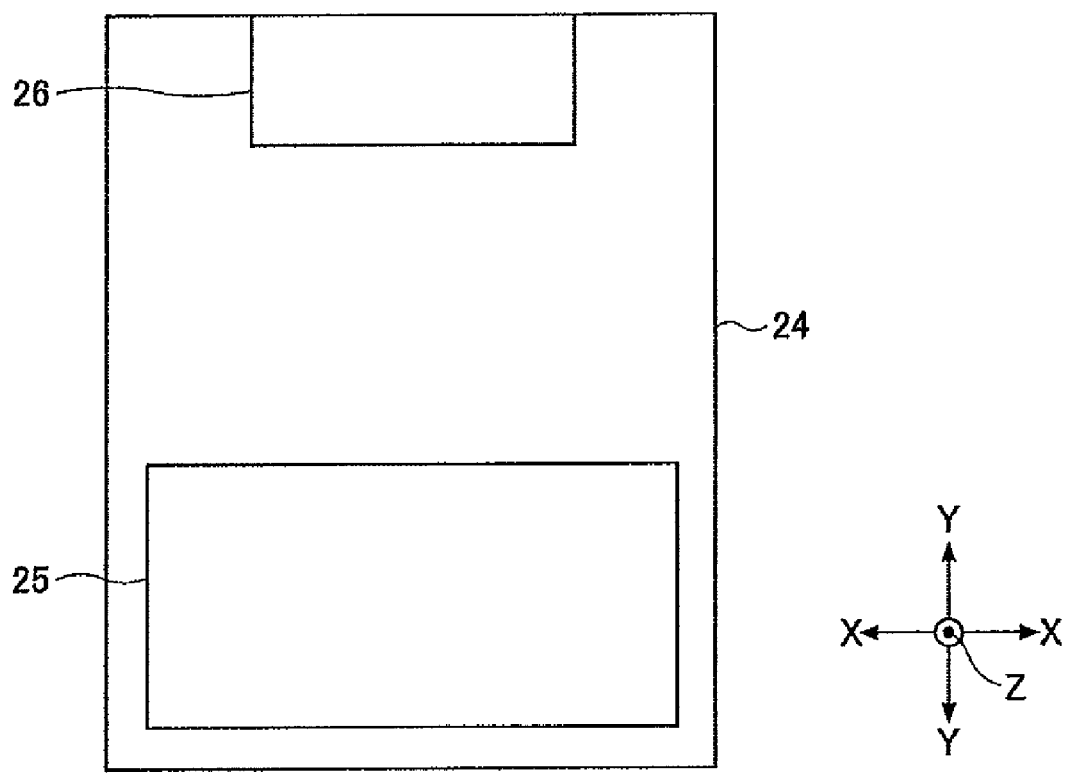
FIG. 13 is a first view of manufacturing steps of the semiconductor detection unit.

FIG. 13 is a first view of manufacturing steps of the semiconductor detection unit 20. FIG. 14 is a second view of the manufacturing steps of the semiconductor detection unit 20. Steps of assembling the semiconductor detection unit 20 are discussed with reference to FIG. 13, FIG. 14 and FIG. 4.

In a step shown in FIG. 13, the semiconductor detection device 25 and the connector 26 are provided and fixed on the wiring board 24. The semiconductor detection device 25 may be provided with positional precision so as to be consistent with the electrodes 24b shown in FIG. 6.

Next, in a step shown in FIG. 14, the spacer 28 is positioned relative to the semiconductor detection device 25 shown in FIG. 13 and the lower surface of the spacer 28 and the upper surface of the wiring board 24 are fixed to each other by the adhesive. More specifically, positioning of the spacer 28 is done by reading two sides 25a and 25b of the semiconductor detection device 25 with an image analysis apparatus and fixing the spacer 28 so that the arm part head end surface 28f and the step part side surface 28g are parallel with the sides 25a and 25b at designated distances $L_X$ and $L_Y$, respectively. As a result of this, the positional relationship between the semiconductor detection device 25 and an X-Y surface of the spacer 28 is determined.

Next, the detection boards 22 are stacked as shown in FIG. 4. Furthermore, while the side surfaces of the spacers 28 are controlled in the X-axial direction and Y-axial direction, the bolts 23a are inserted in the opening parts (not shown) of the supporting base and the opening parts 28-1 of the spacer 28.

More specifically, for example, the side surface 28s in the X-axial direction and the arm part head end surface 28f of the spacer 28 shown in FIG. 14 are controlled and the spacer 28 is pushed so that these surfaces become consistent with each other. As a result of this, the side surfaces of the spacers 28 are controlled in the X-axial direction and Y-axial direction. Since the spacers 28 have the same configurations, positions of the spacers 28 are consistent with each other. Next, the detection boards 22 are fixed by the nuts 23b. Although the detection board 22 is directly fixed to the supporting base 21, the detection boards 22 may be fixed to each other and then the detection boards 22 may be fixed to the supporting base 21. Thus, the semiconductor detection unit 20 is formed.

According to the above-mentioned manufacturing method, the semiconductor detection device 25 of each of the detection boards 22 and the spacer 28 are fixed to each other by positioning them in a designated positional relationship, and the detection boards 22 are fixed to each other by arranging the position of the spacers 28. Hence, the semiconductor detection devices 25 can be provided with high precision.

As an example of the fixing method of the detection board 22, the spacers 28 may be positioned by using the image analysis apparatus when the detection boards 22 are stacked and then the spacers 28 may be fixed by the adhesive. As a result of this, since the projection boards are stacked while the projection boards are being positioned, all of the semiconductor detection devices 25 of the semiconductor detection unit 20 can be arranged and fixed with high precision. In this case, it is not necessary to provide a fixing member having the bolts 23a and the nut 23b shown in FIG. 4.

Figure 15:
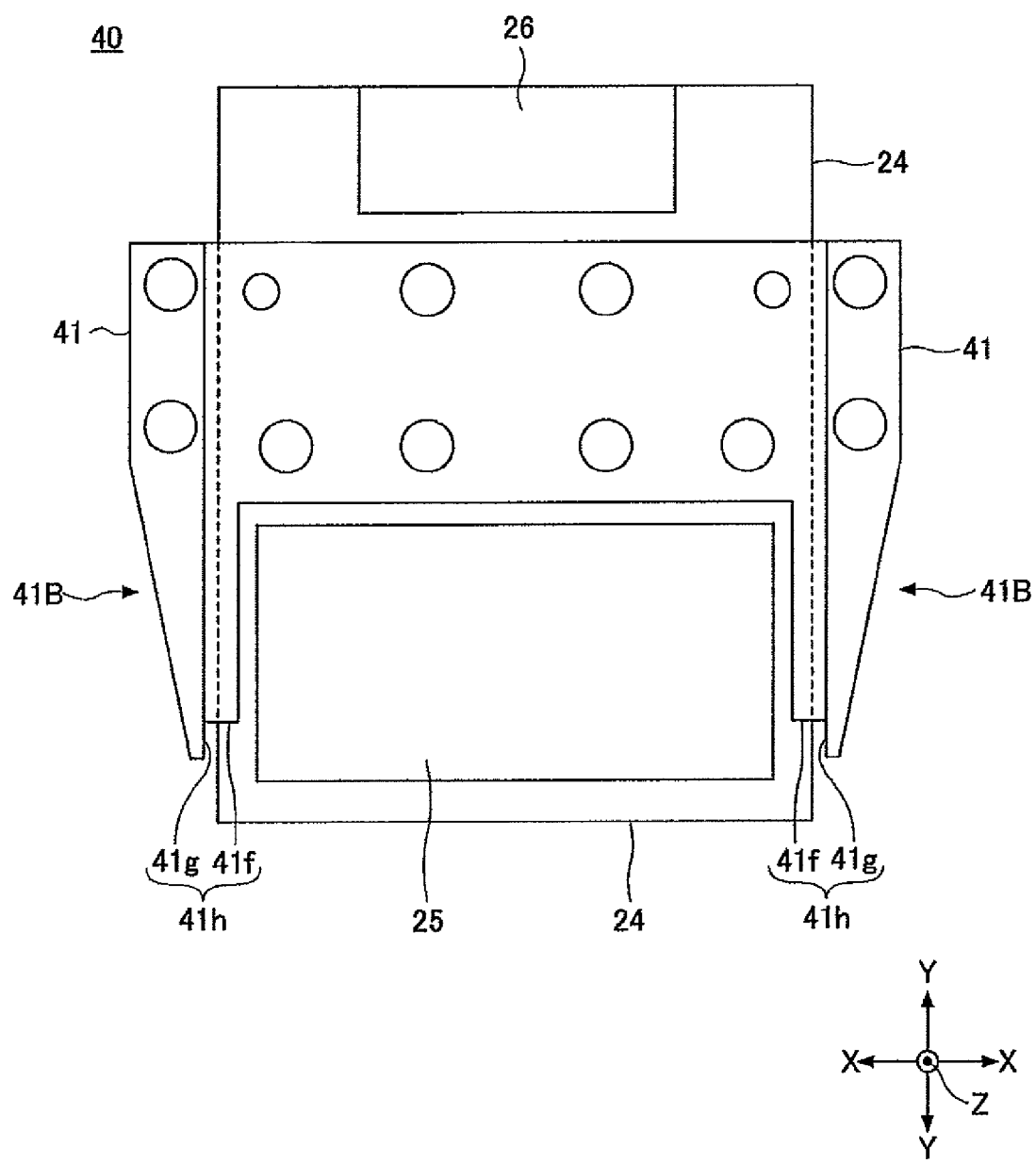
FIG. 15 is a plan view of a first modified example of the semiconductor detection unit.
Figure 16:
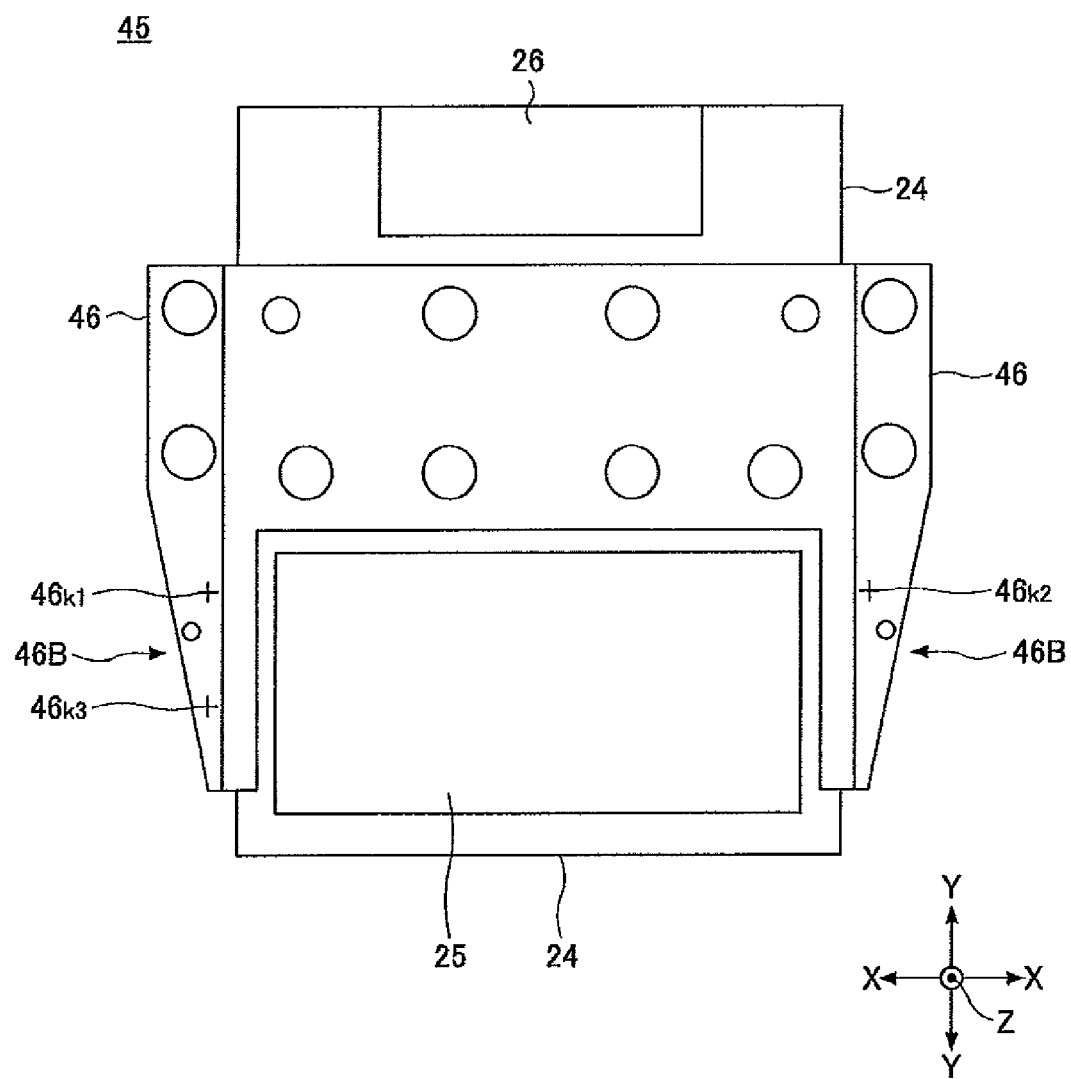
FIG. 16 is a plan view of a second modified example of the semiconductor detection unit.

Next, modified examples of the semiconductor detection unit of the embodiment of the present invention are discussed. FIG. 15 is a plan view of a first modified example of the semiconductor detection unit 40. FIG. 16 is a plan view of a second modified example of the semiconductor detection unit 45. In FIG. 15 and FIG. 16, parts that are the same as the parts shown in FIG. 1 through FIG. 14 are given the same reference numerals, and explanation thereof is omitted.

Referring to FIG. 15 and FIG. 16, the semiconductor detection units 40 and 45 have the same structures as that of the semiconductor detection unit 20 except spacers 41 and 46 are different from the spacer 28. Surfaces and positions for positioning of the spacers 41 and 46 are different from those of the spacer 28.

As shown in FIG. 15, a couple of notch parts 41h formed by two surfaces 41g and 41f perpendicular to each other is formed at head end parts of a pair of the arm parts 41B of the spacer 41. Positions in the X-axial direction and the Y-axial direction of the spacer 41 are determined by standard surfaces 41g and 41f of each of a couple of the notch parts 41h, and the spacer 41 is positioned against the semiconductor detection device 25 in this example as well as the example shown in FIG. 14. As a result of this, the spacer 41 can be arranged with high precision against the semiconductor detection element 25 by forming the notch parts 41h with high precision.

There is no need to provide two notch parts 41h. Only a single notch part 41h may be provided. In this case, positions in the X-axial direction and the Y-axial direction of the spacer are determined by the surfaces 41g and 41f.

In addition, as shown in FIG. 16, three standard marks $46_{k1}$ through $46_{k3}$ are formed on the arm parts 46B. Positions in the X-axial direction and the Y-axial direction of the spacer are determined by a line connecting the standard marks $46_{k1}$ and $46_{k2}$ to each other and a line connecting the standard marks $46_{k1}$ and $46_{k3}$ to each other as standard lines. Because of this, only by forming the standard marks $46_{k1}$ through $46_{k3}$ with high precision, it is possible to provide the spacer 46 against the semiconductor detection device 25 with high precision.

Figure 17:
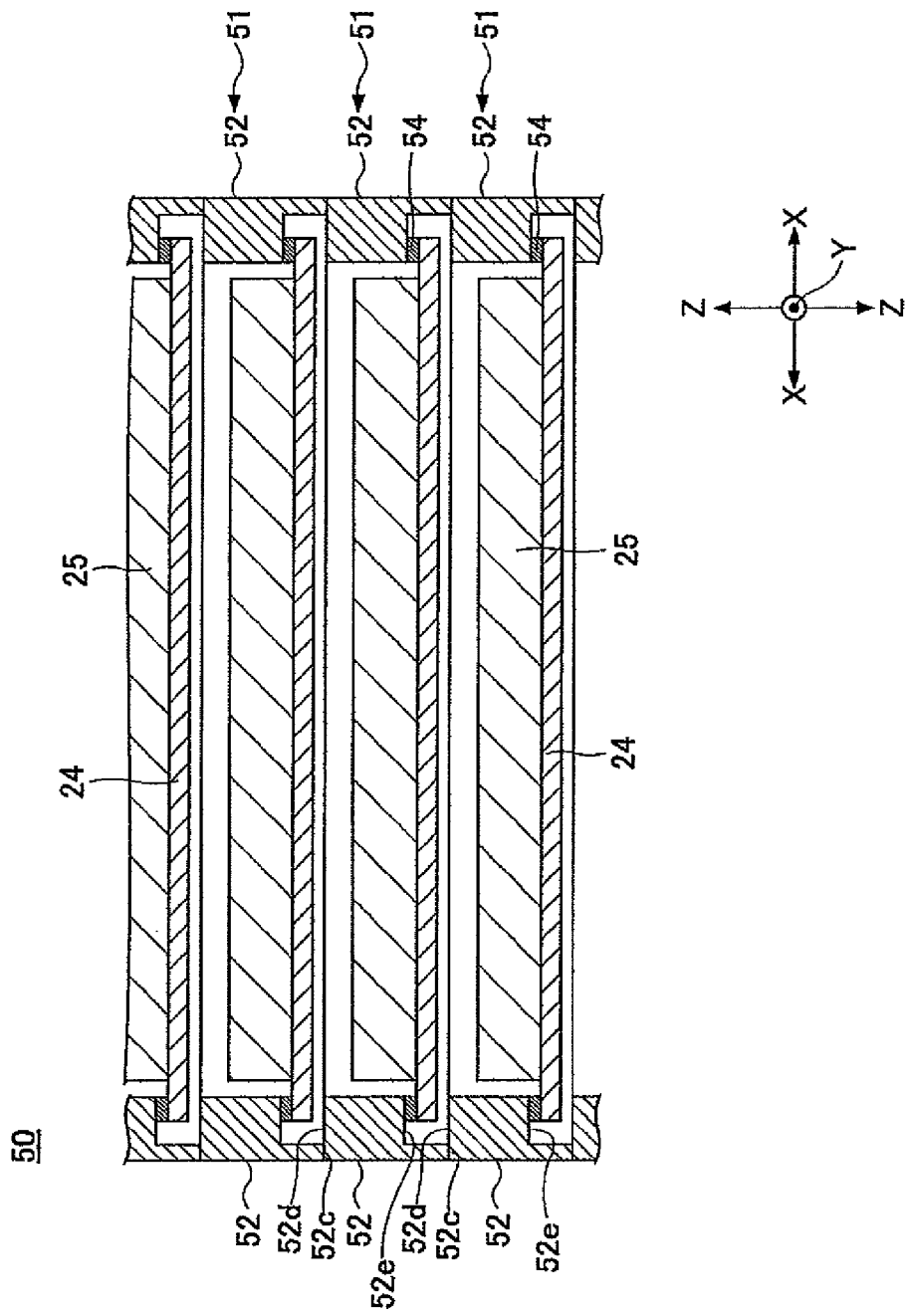
FIG. 17 is a plan view of a third modified example of the semiconductor detection unit.

FIG. 17 is a plan view of a third modified example of the semiconductor detection unit. In FIG. 17, parts that are the same as the parts shown in FIG. 1 through FIG. 16 are given the same reference numerals, and explanation thereof is omitted.

As shown in FIG. 17, the structure of the semiconductor detection unit 50 is the same as that of the semiconductor detection unit 20 shown in FIG. 4 through FIG. 11 (hereinafter "FIG. 4 and other figures") except that a lower surface 52c of the spacer 28 is narrower than the upper surface 52d in the X-axial direction. The upper surface of the wiring board 24 is fixed to the step part 52e. While the semiconductor detection unit 50 can achieve the same effect as that achieved by the semiconductor detection unit 20 shown in FIG. 4 and other figures, the position in the Z-axial direction of the semiconductor detection device 25 is related to distance between the lower surface 52c of the spacer 28 and the step part 52e. The lower surface 52c of the spacer 28 may be polished so that the distance between the lower surface 52c of the spacer 28 and the step part 52e becomes a designated distance.

Figure 18:
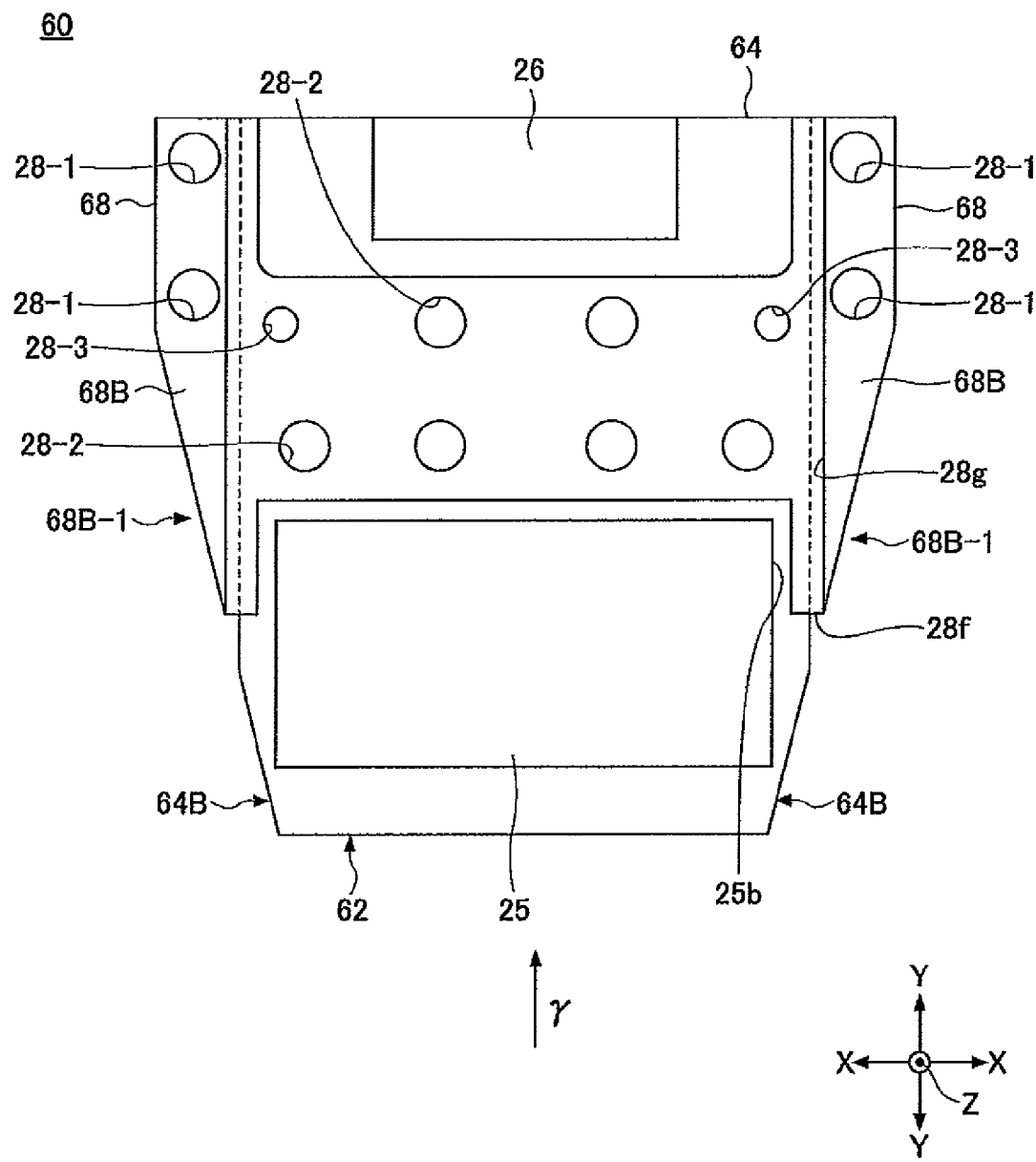
FIG. 18 is a plan view of a fourth modified example of the semiconductor detection unit.
Figure 19:
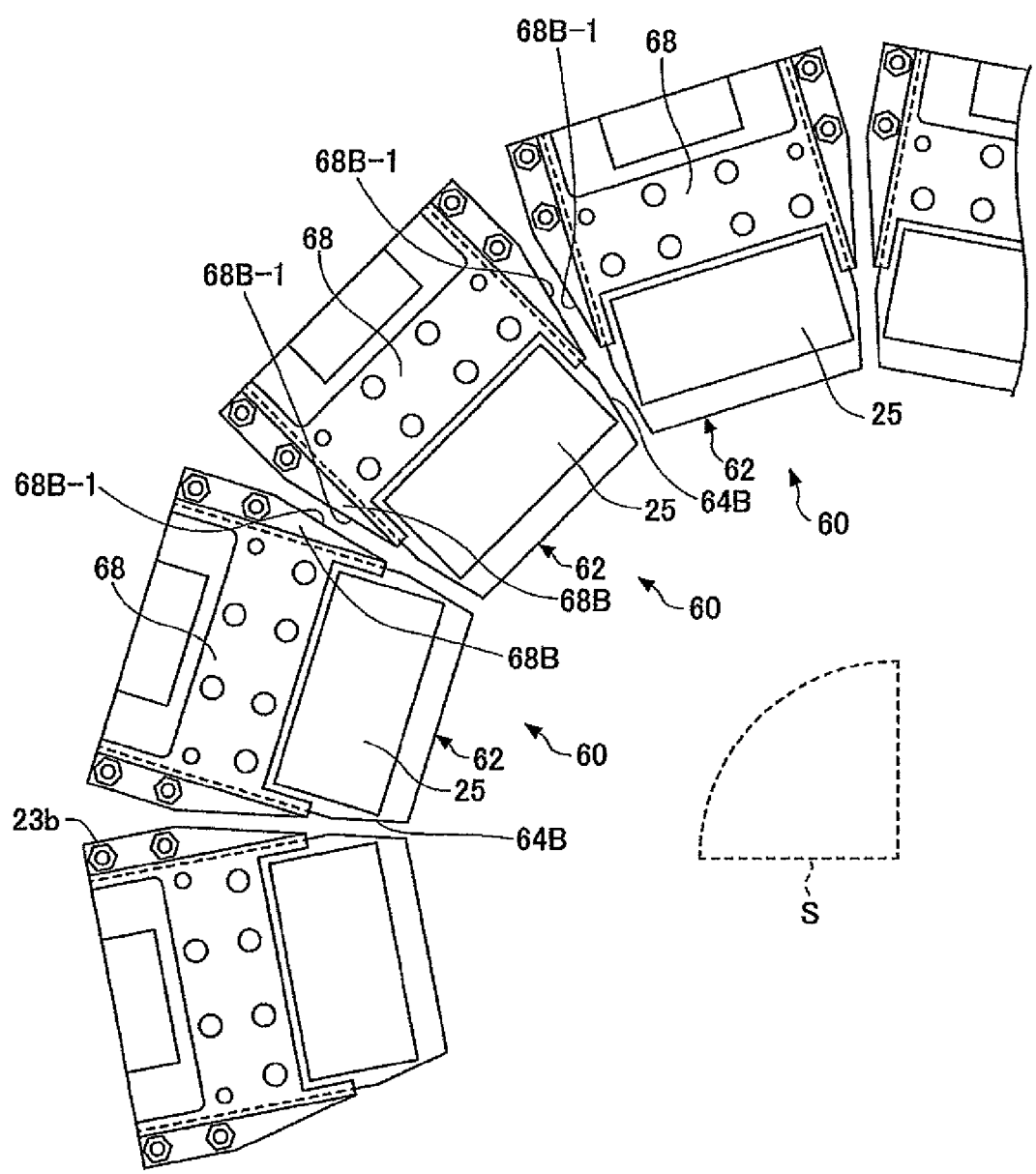
FIG. 19 is a view showing arrangement of the semiconductor detection units shown in FIG. 18 of the PET apparatus.

FIG. 18 is a plan view of a fourth modified example of the semiconductor detection unit. FIG. 19 is a view showing an arrangement of the semiconductor detection units shown in FIG. 18 of the PET apparatus. In FIG. 18 and FIG. 19, parts that are the same as the parts shown in FIG. 1 through FIG. 17 are given the same reference numerals, and explanation thereof is omitted.

As shown in FIG. 18 and FIG. 19, the semiconductor detection unit 60 has the same structure as that of the semiconductor detection unit 20 shown in FIG. 4 except a plane surface configuration of the spacer 68 and a plane surface configuration of the wiring board 64. The wiring board 64 is narrower facing the entry direction of the radiation. More specifically, the wiring board 64 has a configuration where both sides of the outside edges 64B are substantially consistent with virtual lines extending from the corresponding outside edge 68B-1 of the arm parts 68B of the spacer 68. Because of this, as shown in FIG. 19, neighboring semiconductor detection units 60 are provided so that the outside edges 64B of the wiring boards 64 are adjacent to each other. Accordingly, it is possible to closely arrange the neighboring semiconductor detection units 60. As a result of this, it is possible to further reduce the distance between the neighboring semiconductor detection devices 25. Hence, in the semiconductor detection unit 60 compared with the semiconductor detection unit 20 shown in FIG. 12, it is possible to reduce the ratio of the gamma rays going out from the semiconductor detection devices 25 that are not detected. Hence, it is possible to further improve detection efficiency of the PET apparatus.

Although the invention has been described with respect to specific embodiments for a complete and clear disclosure, the appended claims are not to be thus limited but are to be construed as embodying all modifications and alternative constructions that may occur to one skilled in the art that fairly fall within the basic teachings herein set forth.

For example, although the PET apparatus is discussed as an example of the present invention in the above-discussed embodiments, the present invention is not limited to this. The present invention can be applied to an SPECT (single photon-emission computed tomography) apparatus.

This patent application is based on Japanese Priority Patent Application No. 2005-355134 filed on Dec. 8, 2005, the entire contents of which are hereby incorporated herein by reference.

INDUSTRIAL APPLICABILITY

The present invention is applicable to a radiation detection unit having radiation semiconductor detection devices and a radiographic inspection apparatus using the radiation detection units; more specifically, to a radiation detection unit configured to detect gamma rays emitted from a radioisotope situated in a subject and a radiographic inspection apparatus using the radiation detection unit.

The invention claimed is:

1. A radiation detection unit, comprising:
a plurality of detection boards, the detection board having a wiring board;
   a semiconductor detection device fixed on an upper surface of the wiring board and configured to detect radiation; and
   a spacer fixed on the upper surface of the wiring board; and
a fixing member configured to fix a built-up body where the plural detection boards are stacked,
wherein the plural detection boards are arranged so that the semiconductor detection device and the corresponding spacer have a designated positional relationship and the spacers have another designated relationship, and
the spacer is mounted on another spacer so as to directly contact the other spacer when the plurality of detection boards are stacked.

2. The radiation detection unit as claimed in claim 1, wherein a lower surface of the spacer is a plane; and
the lower surface of the spacer and the upper surface of the corresponding wiring board are fixed to each other.

3. The radiation detection unit as claimed in claim 1, wherein the spacer has an opening part;
the opening part pierces the spacer in a thickness direction of the spacer;
the surface of the corresponding wiring board is exposed by the opening part; and
the spacer and the wiring board are fixed to each other by an adhesive introduced in the opening part.

4. The radiation detection unit as claimed in claim 1, wherein each of the spacers of the detection board has the same configuration relative to each other; and
the detection boards are stacked in a manner so that the positions in side directions of the spacers are trued up.

5. The radiation detection unit as claimed in claim 1, wherein a step part is formed on an upper surface of the spacer; and
the detection boards are stacked so that a lower surface of the spacer of an upper side detection board and an upper surface of the spacer of a lower side detection board come in contact with each other and thereby the step parts of the spacer of the lower side detection board and the wiring board of the upper side detection board are prevented from coming in contact with each other.

6. The radiation detection unit as claimed in claim 1, wherein the spacer includes a base part and a pair of arm parts extending from both side parts of the base part to a radiation entry direction side;
the semiconductor detection device is provided at the radiation entry direction side of the base part and between the arm parts; and
the arm part has a tapered configuration where both outside edges are gradually tapered toward the inside at the radiation entry direction side.

7. The radiation detection unit as claimed in claim 6, wherein the wiring board is formed with a configuration where each of both outside edges is consistent with a virtual line formed by extending an outside edge of the arm part.

8. The radiation detection unit as claimed in claim 1, wherein the spacer has a first standard surface and a second standard surface perpendicular to a lower surface of the spacer and forming a designated angle; and
the semiconductor detection device and the spacer have a designated positional relationship based on an external configuration of the semiconductor detection device and the first standard surface and the second standard surface of the spacer.

9. The radiation detection unit as claimed in claim 1, wherein the spacer is made of ceramic material.

10. A radiographic inspection apparatus, comprising:
a radiation detection unit configured to detect radiation generated from a subject including a radioisotope, the radiation detection unit being as claimed in claim 1;
a detection circuit unit connected to the radiation detection unit; and
an information processing part configured to process information about distribution in the subject of the radioisotope based on detected information including an entry time and an entry position of radiation obtained by the detection circuit unit.

11. The radiographic inspection apparatus as claimed in claim 10, wherein a stacking direction of the radiation detection units is substantially parallel with a body axis direction of the subject.

12. The radiographic inspection apparatus as claimed in claim 10,
wherein plural radiation detection units are provided in positions surrounding the subject;
each of the spacers includes a base part and a pair of arm parts extending from both side parts of the base part to a radiation entry direction side;
each of the semiconductor detection devices is provided at the radiation entry direction side of the base part and between the arm parts;
each of the arm parts has a tapered configuration where both outside edges are gradually tapered toward the inside at the radiation entry direction side; and
outside edges of the arm parts of the spacers of neighboring radiation detection units are adjacent each other.

13. The radiation detection unit as claimed in claim 1, wherein a positional relationship of any two adjacent detection boards in the detection boards is determined only by a thickness of the spacer when the detection boards are stacked.

* * * * *